(12) United States Patent
Wung et al.

(10) Patent No.: US 8,104,919 B2
(45) Date of Patent: Jan. 31, 2012

(54) LED LAMP

(75) Inventors: Shih-Hsun Wung, Taipei Hsien (TW); Yong-Dong Chen, Shenzhen (CN); Wen Xu, Shenzhen (CN); Xin-Jian Xiao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 744 days.

(21) Appl. No.: 12/248,898

(22) Filed: Oct. 10, 2008

(65) Prior Publication Data
US 2009/0296393 A1    Dec. 3, 2009

(30) Foreign Application Priority Data

May 28, 2008    (CN) .......................... 2008 1 0067522

(51) Int. Cl.
*F21V 21/02* (2006.01)

(52) U.S. Cl. ............. 362/217.12; 362/217.04; 362/218; 362/147; 362/237; 362/294; 362/800

(58) Field of Classification Search ............. 362/217.12, 362/217.04, 218, 147, 249.02, 237, 238, 362/311.02, 311.06, 367, 370, 342, 294, 362/373

See application file for complete search history.

(56) References Cited

FOREIGN PATENT DOCUMENTS

| | | |
|---|---|---|
| CN | 1762061 A | 4/2006 |
| CN | 101178169 A | 5/2008 |
| CN | 201062727 Y | 5/2008 |
| WO | 2005/055328 A1 | 6/2005 |
| WO | WO 2006067777 A2 * | 6/2006 |

* cited by examiner

*Primary Examiner* — Robert May
*Assistant Examiner* — Leah S Macchiarolo
(74) *Attorney, Agent, or Firm* — Altis Law Group, Inc.

(57) ABSTRACT

An LED lamp comprises a heat sink, a plurality of LED modules respectively disposed at two opposite sides of the heat sink, a casing attached to a front of the heat sink, two envelopes respectively located at the two opposite lateral sides of the heat sink and covering the LED modules therein and a holder connecting the casing for holding the LED lamp in position.

11 Claims, 3 Drawing Sheets

LED LAMP

BACKGROUND OF THE INVENTION

1. Field of the Invention

The disclosure relates to an LED lamp, and more particularly to an LED lamp providing illumination of a large area.

2. Description of Related Art

LED lamps generate brighter light and provide such advantages as low energy consumption, environmental friendliness, and longer lifespan than other light sources.

A commonly used LED lamp comprises a plate-shaped heat sink and an LED module mounted on one side thereof. The LED module includes a PCB and a plurality of LEDs arranged thereon in a discrete linear array. In use, light generated by the LED module directly irradiates the outside of the LED lamp. However, as the LED module is mounted on one side of the heat sink, light produced cannot evenly illuminate area around the LED lamp, making the LED lamp unsuitable for use when a large area requires illumination, such as navigation light.

What is needed, therefore, is an LED lamp which can overcome the limitations described.

SUMMARY OF THE INVENTION

An LED lamp comprises a heat sink with a plurality of LED modules respectively disposed on two opposite lateral sides thereof, a casing attached to a front of the heat sink, two envelopes respectively located at the two opposite lateral sides of the heat sink and covering the LED modules therein, and a holder disposed on the casing for holding the LED lamp in position.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
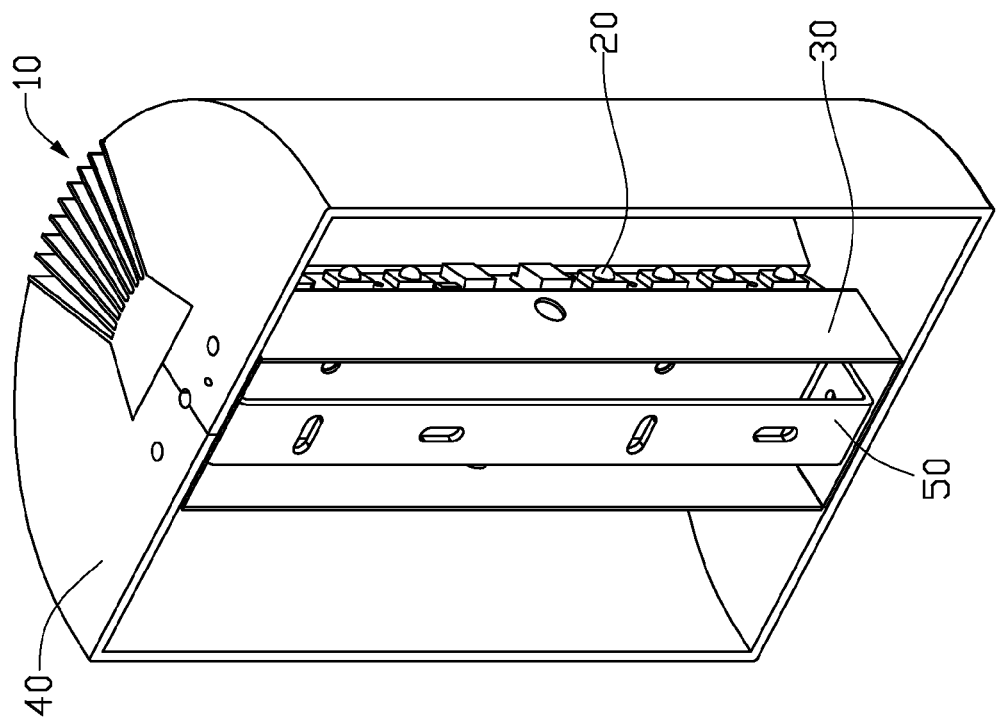
FIG. 1 is an isometric, assembled view of an LED lamp in accordance with an embodiment of the disclosure.
Figure 2:
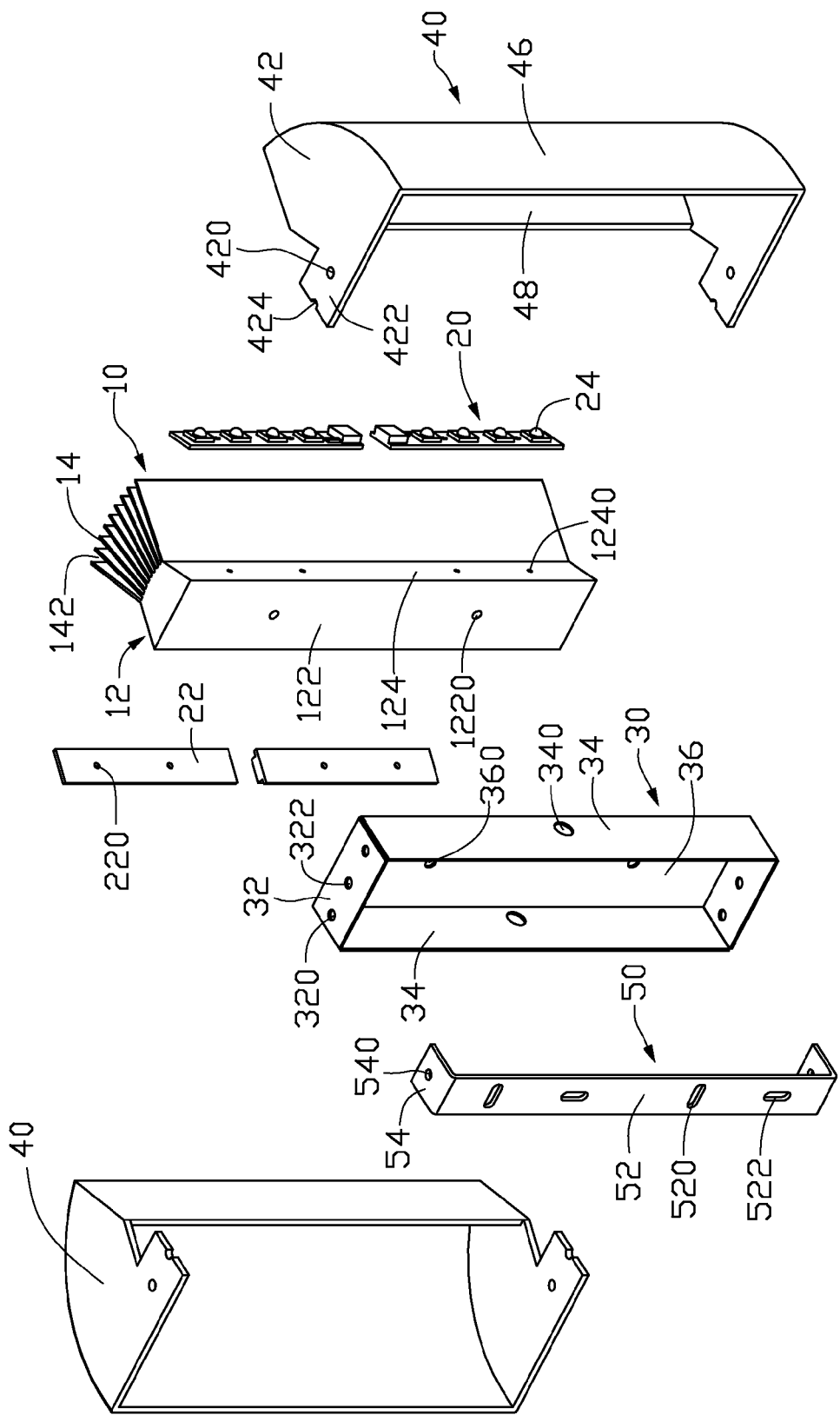
FIG. 2 is an exploded view of FIG. 1.
Figure 3:
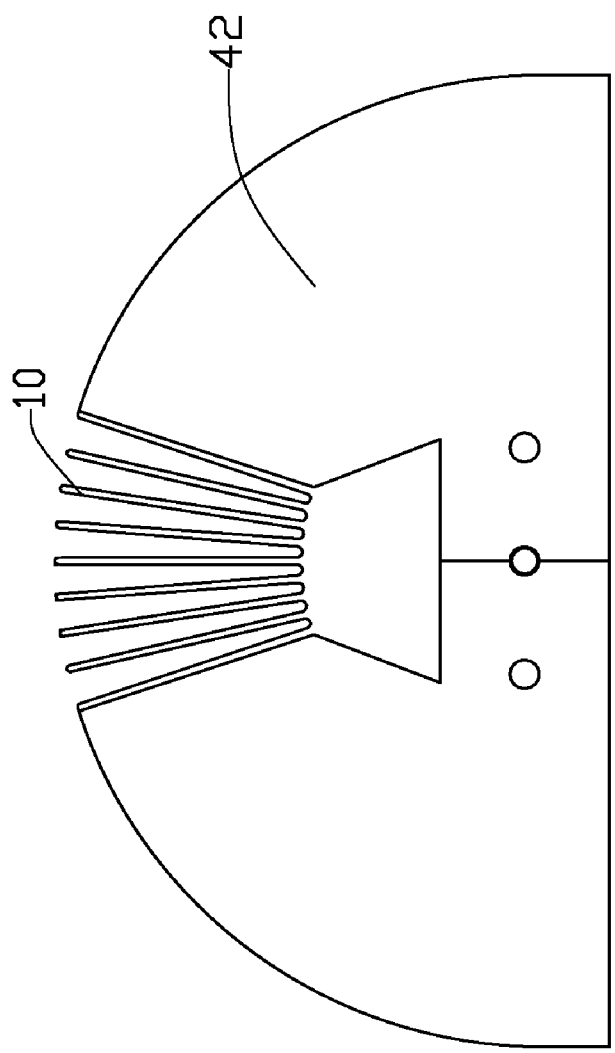
FIG. 3 is a top plan view of FIG. 1.

Referring to FIGS. 1-2, an LED lamp in accordance with an embodiment of the disclosure comprises a heat sink 10, two pairs of LED modules 20 respectively disposed at two opposite lateral sides of the heat sink 10, a casing 30 attached to a front of the heat sink 10, two envelopes 40 symmetrically located at the two opposite lateral sides of the heat sink 10, covering the LED modules 20 therein and combined with the casing 30, and a holder 50 disposed on the casing 30 for holding the LED lamp at a required position.

The heat sink 10 is integrally formed of metal with good heat conductivity such as aluminum, copper, or an alloy thereof. The heat sink 10 includes a prism-shaped heat absorption portion 12 with an isosceles trapezoid cross section and a plurality of fins 14 extending radially from a back surface (not labeled) thereof. The back surface of the absorption portion 12 is smaller than a front surface 122 thereof. The front surface 122 of the heat absorption portion 12 fronts the casing 30 and defines two spaced screw holes 1220 therein. Two opposite lateral side surfaces 124 of the heat absorption portion 12 each define four spaced screw holes 1240. The fins 14 are spaced from each other and form a plurality of channels 142 therebetween allowing airflow to evacuate heat from the fins 14 to ambient air. Free ends of the plurality of fins 14 form a curved surface.

The LED modules 20 each comprise a printed circuit board (hereinafter PCB) 22 and four spaced LEDs 24 mounted thereon. Each PCB 22 defines two through holes 220 corresponding to the screw holes 1240 in the lateral side surface 124 of the heat absorption portion 12. Screws (not shown) through the through holes 220 of the PCBs 22 are received the screw holes 1240 of the lateral side surfaces 124 of the heat absorption portion 12 to mount the LED modules 20 onto the heat absorption portion 12.

The casing 30 comprises two parallel horizontal plates 32 respectively located at a top and a bottom thereof, a rear plate 36 perpendicularly connecting the two horizontal plates 32, and two lateral plates 34 perpendicularly connecting both the two horizontal plates 32 and the rear plate 36. The five plates 32, 34, 36 cooperatively form a chamber (not labeled) receiving a rectifier (not shown). The rear plate 36 of the casing 30 defines two through holes 360 corresponding to the two screw holes 1220 in the front surface 122 of the heat absorption portion 12. Screws (not shown) through the through holes 360 are received in the screw holes 1220 to mount the casing 30 onto the front surface 122 of the heat absorption portion 12. Each horizontal plate 32 defines two screw holes 320 near two ends thereof and a through hole 322 in a center thereof. Each lateral plate 34 defines a circular through hole 340 through which a lead (not shown) connects the pair of LED modules 20 to the rectifier.

Each of the two envelopes 40 comprises two fan-shaped horizontal plates 42 located at a top and a bottom thereof, a curved light transmission plate 46 with two ends thereof respectively connecting two curved edges of the two horizontal plates 42, and a rectangular supporting plate 48 connecting both the two horizontal plates 42 and the light transmission plate 46, preventing the envelope 40 from deforming. Each of the horizontal plates 42 has a substantially rectangular connecting portion 422 projecting from another edge thereof away from the light transmission plate 46. Each connecting portion 422 of the horizontal plate 42 defines a through hole 420 corresponding to one of the screw holes 320 of the horizontal plate 32 of the casing 30. Screws (not shown) through the through holes 420 are received in the screw holes 320 of the horizontal plates 32 to connect the casing 30 and the envelopes 40. A semicircular cutout 424 is defined at a midpoint of an edge of the connecting portion 422. Each envelope 40 has a height equal to that of the heat sink 10.

The holder 50 is received in the casing 30. The holder 50 is a bent rectangular plate and includes a mounting portion 52 and two fixing portions 54 respectively extending perpendicularly from two ends thereof. Two elliptic horizontal holes 520 and two elliptic vertical holes 522 are defined in the mounting portion 52. Each fixing portion 54 defines a screw hole 540 corresponding to the through hole 322 of each horizontal plate 32 of the casing 30. Screws (not shown) through the through holes 322 of the horizontal plates 32 are received in the screw holes 540 of the fixing portions 54 to connect the holder 50 and the casing 30.

During assembly, the two pairs of LED modules 20 are mounted onto the two lateral side surfaces 124 of the heat absorption portion 12 of the heat sink 10; and the casing 30 engages the front surface 122 of the heat absorption portion 12. The two supporting plates 48 of the two envelopes 40 are respectively attached to two outside surfaces of two outmost fins 14 of the heat sink 10, and the two connecting portions 422 of the two horizontal plates 42 of each envelope 40 are attached to the horizontal plates 32 of the casing 30, respectively. The two envelopes 40 surround the casing 30. The two horizontal plates 42 of each envelope 40 are coplanar with top and bottom ends of the heat sink 10, respectively. The cutouts 424 of the two connecting portions 422 are combined to define a through hole (not labeled) corresponding to the through hole 322 of each of the horizontal plates 32 of the casing 30. Finally, the two fixing portions 54 of the holder 50 are brought to attach to two inner surfaces of the two horizontal plates 32 of the casing 30, and combined with the casing 30 and the two envelopes 40 by the screws (not shown). Thus the assembly process of the LED lamp is completed. The assembled LED lamp has a prism-shaped configuration with a semicircular cross section. The free ends of the plurality of fins 14 and the light transmission plate 46 of each envelope 40 cooperatively define a curved surface In an embodiment, the LED lamp can be prism-shaped with a triangular cross section, accomplished by changing the shape of the envelopes 40 and the heat sink 10.

Compared with other light sources, the LED lamp of the disclosure provides a plurality of LED modules 20 respectively disposed at two opposite sides of the heat sink 10, such that light generated thereby irradiates over a large area.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp, comprising:
a heat sink;
a plurality of LED modules attached to two opposite sides of the heat sink; and
two envelopes located at the two opposite sides of the heat sink and covering the plurality of LED modules;
wherein the heat sink comprises a prism-shaped heat absorption portion and a plurality of fins extending from a back surface of the heat absorption portion, the LED modules being attached to two opposite lateral side surfaces of the heat absorption portion, and the fins being located between the two opposite lateral side surfaces of the heat absorption portion;
wherein the LED lamp further comprises a casing mounted on a front surface of the heat absorption portion of the heat sink; and
wherein the casing comprises two horizontal plates, a rear plate perpendicularly connecting the two horizontal plates, and two lateral plates perpendicularly connecting both the two horizontal plates and the rear plate, and the rear plate of the casing being attached to the front surface of the heat absorption portion of the heat sink.

2. The LED lamp as claimed in claim 1, wherein the two envelopes are symmetrical with respect to the heat sink, resulting in the LED lamp having a prism-shaped configuration with a semicircular cross section.

3. The LED lamp as claimed in claim 1, wherein the heat absorption portion has an isosceles trapezoid cross section, the fins extending radially from the back surface of the heat absorption portion.

4. The LED lamp as claimed in claim 1, wherein each envelope comprises two horizontal plates, a light transmission plate with two ends thereof respectively connecting edges of the two horizontal plates and a supporting plate connecting both the two horizontal plates and the light transmission plate, the two horizontal plates being coplanar with a top and bottom of the heat sink respectively, and the supporting plate abutting an outside surface of an outmost fin of the heat sink.

5. The LED lamp as claimed in claim 4, wherein free ends of the plurality of fins and the light transmission plate define a curved surface.

6. The LED lamp as claimed in claim 4, wherein a connecting portion projects from another edge of each of the two horizontal plates of each envelope and is connected to a corresponding one of a top and a bottom of the casing.

7. The LED lamp as claimed in claim 1, wherein the LED lamp further comprises a holder received in the casing, the holder comprising a mounting portion and two fixing portions respectively extending perpendicularly from two ends of the mounting plate, the two fixing portions respectively connecting the two horizontal plates of the casing.

8. An LED lamp, comprising:
a heat sink;
a plurality of LED modules attached to two opposite sides of the heat sink;
a plurality of fins extending from a first side of the heat sink between the two opposite sides of the heat sink; and
two envelopes located at the two opposite sides of the heat sink and covering the plurality of LED modules, wherein each envelope has a rectangular supporting plate abutting an outside surface of a corresponding outmost one of the plurality of fins;
wherein the heat sink has a second side opposite the first side and between the opposite sides, the second side having an area larger than that of the first side, a trough-shaped casing having a rear plate being attached to the second side of the heat sink, each envelope further comprising top and bottom horizontal plates between which the supporting plate is extended, the horizontal plates being connected to the casing, and a curved light transmission plate among the supporting plate and the horizontal plates.

9. The LED lamp as claimed in claim 8, wherein the fins radially extend from the first side of the heat sink.

10. The LED lamp as claimed in claim 8 further comprising a holder for holding the LED lamp at a required position, the holder being received in the casing and secured to the casing.

11. An LED lamp, comprising:
a heat sink;
a plurality of LED modules attached to two opposite sides of the heat sink; and
two envelopes located at the two opposite sides of the heat sink and covering the plurality of LED modules;
wherein the heat sink comprises a prism-shaped heat absorption portion and a plurality of fins extending from a back surface of the heat absorption portion, the LED modules being attached to two opposite lateral side surfaces of the heat absorption portion, and the fins being located between the two opposite lateral side surfaces of the heat absorption portion;

wherein the LED lamp further comprises a casing mounted on a front surface of the heat absorption portion of the heat sink;

wherein each envelope comprises two horizontal plates, a light transmission plate with two ends thereof respectively connecting edges of the two horizontal plates and a supporting plate connecting both the two horizontal plates and the light transmission plate, the two horizontal plates being coplanar with a top and bottom of the heat sink respectively, and the supporting plate abutting an outside surface of an outmost fin of the heat sink; and wherein a connecting portion projects from another edge of each of the two horizontal plates of each envelope and is connected to a corresponding one of a top and a bottom of the casing.

* * * * *